United States Patent
Fuchs et al.

(10) Patent No.: US 9,568,515 B2
(45) Date of Patent: Feb. 14, 2017

(54) ENERGY CONSUMPTION DETERMINATION FOR DOMESTIC APPLIANCES IN A NETWORK OF SEVERAL DOMESTIC APPLIANCES WHICH FORM A SYSTEM

(75) Inventors: Gerhard Fuchs, München (DE); Claudia Häpp, München (DE); Ingo Pietsch, München (DE)

(73) Assignee: BSH Hausgeraete GmbH, Munich (DE)

(*) Notice: Subject to any disclaimer, the term of this patent is extended or adjusted under 35 U.S.C. 154(b) by 653 days.

(21) Appl. No.: 14/112,376

(22) PCT Filed: Apr. 23, 2012

(86) PCT No.: PCT/EP2012/057388
§ 371 (c)(1),
(2), (4) Date: Oct. 17, 2013

(87) PCT Pub. No.: WO2012/146559
PCT Pub. Date: Nov. 1, 2012

(65) Prior Publication Data
US 2014/0032140 A1    Jan. 30, 2014

(30) Foreign Application Priority Data
Apr. 27, 2011    (DE) .................. 10 2011 017 574

(51) Int. Cl.
*G01R 21/00*    (2006.01)
*H02J 3/14*    (2006.01)
(Continued)

(52) U.S. Cl.
CPC ............... *G01R 21/00* (2013.01); *H02J 3/14* (2013.01); *H02J 13/0062* (2013.01);
(Continued)

(58) Field of Classification Search
CPC .... G01R 21/00; G01R 21/133; H02J 13/0062; H02J 2003/143; H02J 3/14; Y02B 70/3225; Y02B 70/3266; Y02B 90/2638; Y04S 20/222; Y04S 20/242; Y04S 40/124
(Continued)

(56) References Cited

U.S. PATENT DOCUMENTS

| 4,644,320 | A | 2/1987 | Carr et al. |
| 5,483,153 | A | 1/1996 | Leeb et al. |

(Continued)

FOREIGN PATENT DOCUMENTS

| CA | 2 748 172 | 7/2009 |
| DE | 601 29 437 T2 | 4/2008 |

(Continued)

OTHER PUBLICATIONS

English translation of EP 1136829 A1, public date: Sep. 26, 2001.*

(Continued)

*Primary Examiner* — John H Le
(74) *Attorney, Agent, or Firm* — Laurence A. Greenberg; Werner H. Stemer; Ralph E. Locher

(57) ABSTRACT

A system of domestic appliances is provided, wherein the domestic appliances are operated from a branch of an, in particular public, supply system for electrical energy at a customary system frequency, wherein, in particular, the consumed energy which is supplied to the branch can be detected, and wherein a display and measurement unit is present, allowing the energy consumed by an individual domestic appliance to be displayed and measured. In this case, the functioning thereof for determining the consumption of the individual domestic appliance is based on the analysis of a characteristic structure, which can be assigned to the individual domestic appliance, of current and/or voltage profiles within system period time intervals during operation of the individual domestic appliance, wherein, for individual domestic appliances of which the inherent characteristic structure is small, the characteristic structure can be formed or added to by a structure generator.

10 Claims, 2 Drawing Sheets

(51) Int. Cl.
*H02J 13/00* (2006.01)
*G01R 21/133* (2006.01)

(52) U.S. Cl.
CPC ....... *G01R 21/133* (2013.01); *H02J 2003/143* (2013.01); *Y02B 70/3225* (2013.01); *Y02B 70/3266* (2013.01); *Y02B 90/2638* (2013.01); *Y04S 20/222* (2013.01); *Y04S 20/242* (2013.01); *Y04S 40/124* (2013.01)

(58) Field of Classification Search
USPC ............... 702/60, 62; 324/76.12; 340/12.37, 340/870.02; 700/291
See application file for complete search history.

(56) References Cited

U.S. PATENT DOCUMENTS

| | | | |
|---|---|---|---|
| 5,717,325 A | 2/1998 | Leeb et al. | |
| 6,993,417 B2* | 1/2006 | Osann, Jr. | G05B 15/02 |
| | | | 340/635 |
| 2010/0191487 A1 | 7/2010 | Rada et al. | |
| 2011/0046904 A1 | 2/2011 | Souilmi | |

FOREIGN PATENT DOCUMENTS

| | | |
|---|---|---|
| DE | 20 2008 009 128 U1 | 1/2009 |
| EP | 1 136 829 | 9/2001 |
| WO | WO 2011/035301 A2 | 3/2011 |

OTHER PUBLICATIONS

International Search Report for PCT/EP2012/057388 mailed Jul. 19, 2012.
Foreign Language Written Opinion of the International Searching Authority mailed Jul. 19, 2012.
G. Hart, "Nonintrusive Appliance Load Monitoring", Proceedings of the IEEE, IEEE, vol. 80, No. 12, Dec. 1, 1992, pp. 1870-1891.
Notification Concerning Transmittal of International Preliminary Report on Patentability for corresponding PCT/EP2012/057388, dated Oct. 29, 2013, 9 pages.
German Office Action for DE Application No. 10 2011 017 574.1, dated Nov. 28, 2011, 6 pages.
G. Hart, "Nonintrusive Appliance Load Monitoring", Proceedings of the IEEE, vol. 80, No. 12, Dec. 1, 1992, 22 pages.

* cited by examiner

ENERGY CONSUMPTION DETERMINATION FOR DOMESTIC APPLIANCES IN A NETWORK OF SEVERAL DOMESTIC APPLIANCES WHICH FORM A SYSTEM

This application is the U.S. national phase of International Application No. PCT/EP2012/057388 filed 23 Apr. 2012 which designated the U.S. and claims priority to DE 10 2011 017 574.1 filed 27 Apr. 2011, the entire contents of each of which are hereby incorporated by reference.

The invention relates to the determination of the consumption of a domestic appliance in a grouping of a number of domestic appliances which form a system.

BACKGROUND OF THE INVENTION

Field of the Invention

In order to manage the energy consumed in a domestic context in an aware and responsible manner the user of appliances in a household has to have precise and full knowledge of the consumption of said appliances. To this end it is advantageous if consumption data for said appliances is available, in particular energy efficiency classes, with generally associated annual consumption data. However if such information is not available or the user of domestic appliances is unable to assign the electrical energy consumption to be paid for with an electricity company over a certain time period, for example a year, to the appliances in the household in a plausible manner, the user is forced to keep track of the energy consumption of individual appliances in a systematic manner.

A great deal of information is available to the public, in particular on the internet, about how to proceed in an aware manner with electrical energy, in particular in a domestic context. An article with the title "Stromverbrauch mit dem Stromzähler messen" (Measuring energy consumption using the electricity meter) by M. Bockhorst, available on the internet from Apr. 26, 2011 at http://www.energieinfo.de/energiesparen/energiespartipps_stromverbrauch_mit_dem-_stromzaehler_messen.html, gives instructions about how the energy consumption of a domestic appliance can be determined by writing down the meter reading of a domestic electricity or energy meter before and after switching off said appliance, This procedure can be extended to almost all appliances to obtain a comprehensive overall result. As such a procedure is complicated and only represents a snapshot however it may not be widely accepted.

Measuring devices are also available, which can be assigned to an individual socket, in the manner of a timer switch, and can therefore be used to measure the consumption of an appliance connected to the output socket of such a measuring device. As domestic appliances at the high end are often integrated, in kitchen units for example, this type of essentially feasible energy measurement per individual domestic appliance should in many instances be ruled out. Also it is inconvenient to operate such measuring devices, which have to be plugged into a domestic socket, as domestic sockets are generally located just, for example 30 cm, above the floor and are therefore easy to read and set individually.

One remedy for this could be for each domestic appliance to display its energy consumption, for example on its operating panel. However this would also require assigned measuring means for each domestic appliance, which would make the relevant domestic appliance more expensive.

A monitoring device and associated method are set out in US 2010/0191487 A1, according to which electrical consumers, which are present in particular on a branch of a supply network, can be identified in respect of their operating behavior. To this end a so-called "signature" or authentication of the respective consumer is used, which takes into account a plurality of electrical data of the respective consumer, including the spectrum of the harmonic content of the current flowing through the consumer. A data record taking into account the authentication of the respective consumer can also be stored in a storage unit. The behavior of the individual consumers and also their consumption in respect of certain consumption periods can be displayed or information is supplied, which can be transmitted in a wired or wireless manner to another location. However with the doctrine according to US 2010/0191487 A1 it is assumed that a "signature" or authentication can also actually be assigned to each consumer. However this might encounter problems, if the outlay for the physical technology of a monitoring device is to be kept low.

This is where the invention comes in. The aim is to find a way of considering the energy consumption of domestic appliances, which are operated on a line section or branch of a supply network, in a combined manner, without increasing the outlay for the authentication of an individual consumer or domestic appliance in a non-transparent manner.

BRIEF SUMMARY OF THE INVENTION

The object of the invention is therefore to allow the determination of the consumption of a domestic appliance in a grouping of a number of domestic appliances, which form a system, in a simple manner.

This object is first achieved for a system of domestic appliances, wherein the domestic appliances are operated on a branch of an, in particular public, supply network for electrical energy at a standard network frequency, for example 50 Hz or 60 Hz, and for corresponding network period time segments (20 ms, 16.67 ms), wherein in particular the consumed energy supplied to the branch can be detected and wherein a display and measuring unit is present, which allows the display and measurement of the consumed energy of an individual domestic appliance, wherein also its function of determining the consumption of the individual domestic appliance is based on the analysis of a characteristic structure of current and voltage profiles that can be assigned to the individual domestic appliance within network period time segments, during operation of the individual domestic appliance, wherein the characteristic structure of individual domestic appliances whose own characteristic structure is small can be formed or added to by a structure generator (ESM, ES1 to ESN).

The invention is based on the knowledge that each domestic appliance in the system of domestic appliances gives rise to a specific network load during a continuous operating phase and in particular when switched on and off, as each domestic appliance, due to the nature of the components in said appliance, such as ohmic resistors, inductors and capacitors, also contains non-linear components, such as controlled and non-controlled diodes, switches and the like, which therefore bring about not only a displacement of the phase of the drawn current in respect of the fundamental wave of the voltage in relation to the network frequency but also a current profile overlying the fundamental wave, which can be analyzed in relation to the fundamental wave by means of harmonics or oscillations of the current with a higher frequency than the basic frequency. Depending on the type of branch on which the domestic appliances are located, voltage harmonics corresponding to the current harmonics can also be identified. Just as certain domestic appliances can be identified by their typical noise, in particular during operation, as often happens with the human ear, such noise generally being due to current harmonics and triggering the relevant acoustic oscillation as a result of induction onto a membrane-type part in the housing of the respective domestic appliance, the harmonic component characteristic of the relevant domestic appliance, which therefore has oscillation period segments below the duration of the network period, can be identified in the same manner by other frequency-selective receptors. If an individual domestic appliance does not have an adequate, distinguishable characteristic structure, a structure generator is used which can be operated, at least in a supporting manner, to form a distinguishable characteristic structure for said domestic appliance.

The consumed energy can be measured in different ways. A meter principle can be used, as with conventional energy consumption meters of the supply companies, or novel electricity meters such as smart meters, are used, which allow a product of voltage and current relative to a measurement segment to be detected in particular also for short time periods. It is however important that the detected energy can be allocated reliably to an individual domestic appliance or a number of defined domestic appliances by identifying their harmonic component.

A display and measuring unit based on such principles can either be assigned to a device configured specifically for the purpose or provision is made for one of the domestic appliances in the system of domestic appliances to accommodate said display and measuring unit. In the latter instance said domestic appliance is considered to be the master domestic appliance.

It is known that the energy drawn in a household from a public energy supply company or EVU is measured by an electricity or energy meter supplied specifically by said company. As according to the invention all the energy consumed in a household is also to be measured, it is also appropriate to replace the energy meter supplied by the EVU with the inventive display and measuring unit, which would however assume a contractual relationship with the EVU. If the electrical energy of the relevant household is supplied by its own energy supply or one based on a private agreement, in particular based on renewable energies, it should not be difficult to use the inventive display and measuring unit for this purpose.

The harmonics of a domestic appliance in the system of domestic appliances, which produce the characteristic structure, are generally based on the harmonics of the relevant domestic appliance itself. It can however happen that a consumer of a household, which is to be considered as a domestic appliance, does not have typical switch-on and switch-off characteristics and also does not generate harmonics during continuous operation but its consumption has to be detected or displayed in an individualized manner. The invention then provides for a structure generator, which generates a characteristic structure, for example an appropriately excited oscillating circuit, to be added to said domestic appliance, to inject a certain measure of harmonics allowing its identification in the sense of feedback into the branch of the network. It should be possible to operate the structure generator itself almost without energy consumption.

As it is also possible that domestic appliances do not generate a very favorable structure of voltage and current profiles for their identification, it may also be appropriate to change their structure to achieve the characteristic structure. It may be necessary for example to suppress a defined frequency range, which would also interfere with the radio frequency range, and strengthen another frequency range, which is suitable for identifying a characteristic structure.

The display and measuring unit which is part of the invention also has a visualization part, which comprises the display region for the energy consumption of the individual domestic appliances and preferably also all the domestic appliances in the system of domestic appliances. If a master domestic appliance is used, which accommodates the display and measuring unit anyway, it is recommended that its visualization part is assigned to the operating panel of said master domestic appliance, while the electrical and electronic components used for signal and data processing in the display and measuring unit are accommodated in the interior of the master domestic appliance, preferably combined with its actual process controller.

Although it is possible to use analog signal processing to check a profile mapped as a signal, in particular of the current, of the system of domestic appliances for certain harmonics and their amplitude size and therefore to be able to identify a domestic appliance that is operating or starting or ending, the characteristic structure of current and voltage profiles within network period time segments is preferably identified digitally being replaced or supplemented as necessary by the structure generated by a structure generator. Thus the signal corresponding to the system or appliance current profile or the signal corresponding to the structure generator is therefore converted to digital by means of an analog/digital converter and used in an analyzer to assign the consumed energy of the associated domestic appliance in relation to a stored comparison range by means of an identification unit. The comparison ranges can be stored particularly efficiently in digital storage units and can be subjected to data processing by a processor unit.

It is therefore possible without further ado to obtain the comparison range for the analyzer by means of initialization procedures of the domestic appliance system and then store it preferably in an internal storage unit of the display and measuring unit, which can be read in and out by the processor unit by way of a databus.

The comparison range for the analyzer can also be stored in an external storage unit. This external storage unit is connected to the display and measuring unit by way of a data transmission link, for example by way of the internet. Such an external or virtual storage unit can be located at any location in a computer that has a connection to the internet. Such a storage unit is also referred to as a "cloud". It is therefore preferably possible for the abovementioned comparison range to be supplied by a manufacturer of the relevant domestic appliance on a computer provided for the purpose.

Data that is produced during the operation of the domestic appliances in the domestic appliance system can also be read into such a computer so that the manufacturer of the domestic appliances or a service company can access it to optimize the domestic appliances. In particular the instantaneous values of the power of the domestic appliances in the domestic appliance system can be transferred to such a storage unit, particularly as said values are also supplied anyway by way of a display means for the visualization part of the display and measuring unit.

In so far as the inventive system of domestic appliances is to be installed in a household, in particular together with the master domestic appliance, it may be expedient to supply installation material relating thereto, for example as an assembly kit. Thus a branch from a distribution point of the energy supply network can be passed first to the master domestic appliance in the relevant household and then from the master domestic appliance to the further domestic appliances.

In so far as the invention is developed by non-independent claims that relate back to the independent claims, it should be such that an initially specified chain of relationships should not be considered to be restrictive in respect of the doctrine set out as a whole, in so far as other combinations of features of claims appear appropriate and feasible from the point of view of the person skilled in the art.

BRIEF DESCRIPTION OF THE SEVERAL VIEWS OF THE DRAWING

The invention is described in more detail below based on the exemplary embodiments illustrated schematically in the accompanying drawing. Identical reference characters designate identical or comparable parts in each instance. The figures in the drawing are described briefly first.

DETAILED DESCRIPTION OF THE INVENTION

Figure 1:
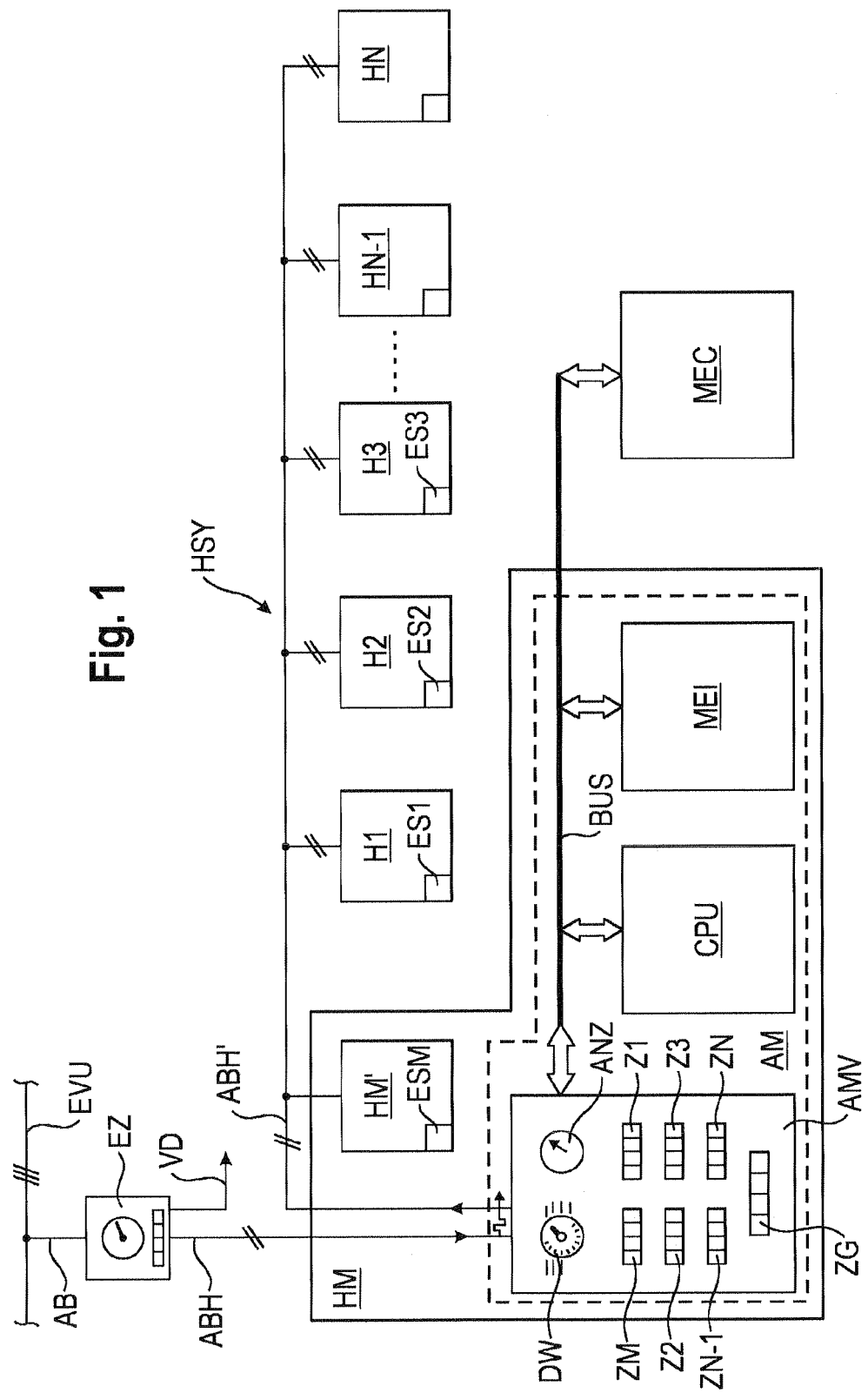
FIG. 1 shows an overall arrangement of the system of domestic appliances in relation to a household.

FIG. 1 shows a supply line of a network of a public supply company EVU. A branch AB of said network is fed to a system of domestic appliances in a household. A standard energy meter EZ of the EVU is initially provided, being embodied according to the requirements of the EVU or being supplied by it. It can also be an intelligent energy meter, usually referred to as a smart meter, the output signals of which can also influence the switch-on conditions for domestic appliances, in particular in respect of tariff information. However this option is not examined further in the description which follows of an embodiment of the invention but consideration of said option is not excluded in the present instance.

Connected to the output of the energy meter EZ of the EVU are essentially the domestic appliances, which relate to the system of domestic appliances HSY to be considered according to the invention. Outside the system are also various consumers VD, such as lights with energy-saving lamps or heating circulation pumps, the energy consumption components of which are of little consequence and are therefore not described in further detail for the system of domestic appliances, in this exemplary embodiment illustrated by way of example. Generally however it is possible in the present instance to consider all the appliances in a household.

The branch ABH containing the domestic appliances in the system of domestic appliances HSY is first looped through by a display and measuring unit AM, before all the domestic appliances in the system of domestic appliances HSY are supplied with power or electrical energy. The display and measuring unit AM first comprises a visualization part AMV, which can be adapted to the configuration of an operating panel of a domestic appliance or can even be configured differently. All that is important is that the energy consumption values of the domestic appliances in the system of domestic appliances HSY can be displayed and also that a current condition, for example current consumption of an individual domestic appliance, can be displayed as power or energy for an integration period, such as an hour, selected for example by way of a rotary selector DW, by way of an analog or digital display instrument ZN.

The physical parts of the display and measuring unit AM, which do not serve for direct visualization, relate to its information processing. Provision is made for a data exchange by way of a databus BUS, which on the one hand supplies the momentary values of current and voltage to a central processing unit CPU between the measuring sensors (not shown) but on the other hand supplies the data relating to the results obtained in respect of the instantaneous power of a domestic appliance and the combined calculated energy consumption per domestic appliance to the visualization part AVM. The databus BUS is also connected to storage units, which are configured internally, shown as MEI, in the appliance AM and are present externally, shown as MEC, outside the appliance AM. This external connection to the storage unit MEC can be achieved by way of the internet by cable or wirelessly, in other words by way of a data transmission link. The external storage unit can be implemented on any computer available throughout the world. The term cloud is used as standard for such storage units on a remote computer. Processing operations taking place below the central computation unit CPU, based on stored programs in the storage unit MEI, are examined further below.

Provision is made for the measuring and display unit AM as a whole to be configured either as a standalone device and thus for the branch to the system of domestic appliances HSY to be looped through by said device in order to be able to detect the momentary values of voltages and currents. It is however also possible for the display and measuring unit AM to be a component of a domestic appliance, which is then referred to as the master domestic appliance HM. The actual domestic appliance of the master domestic appliance is then identified as HM'. It is connected at the output of the loop (not shown in detail) passed through the measuring and display unit AM, said branch then being identified as ABH' from the output of the display and measuring unit. Further domestic appliances H1, H2, H3 . . . HN−1 and HN are then connected to this branch.

It is recommended here that a domestic appliance such as a washing machine or tumble dryer, which is in any case located close to the branch ABH of the domestic installation (with electricity meter EZ), is provided as the master domestic appliance HM. It is then also possible to make the branch ABH' easily accessible for the further domestic appliances H1 to HN in the domestic installation (preferably for the kitchen, for example dishwasher, oven, induction cooktop, refrigerator and freezer). An assembly kit can be provided for this purpose.

Figure 2:
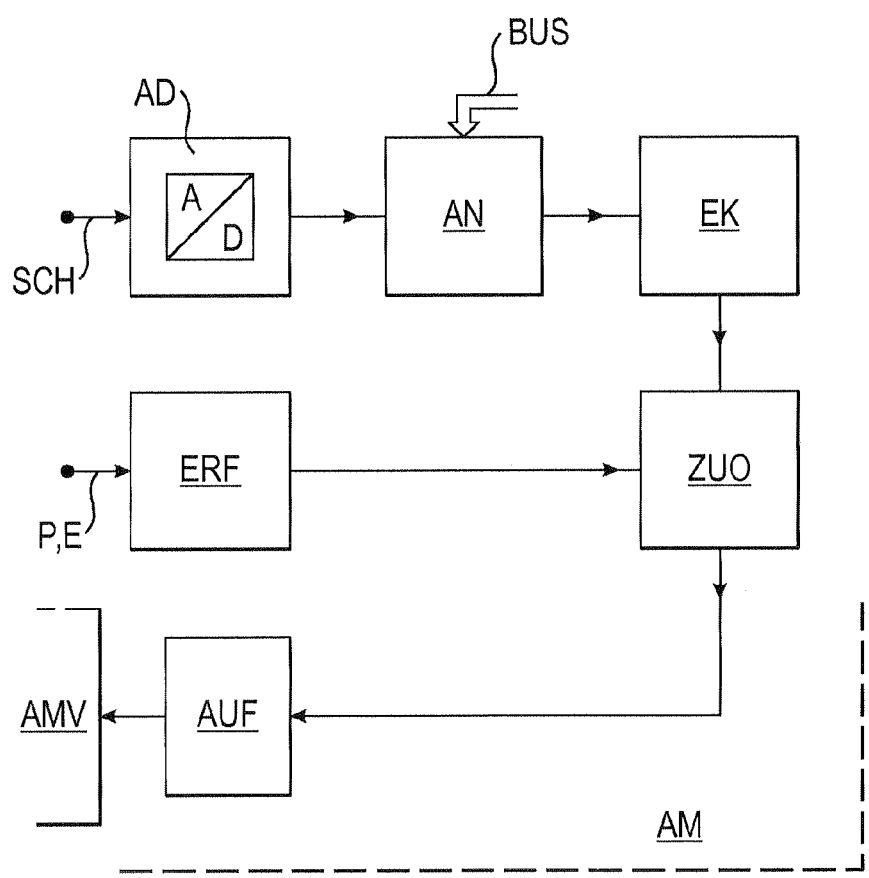
FIG. 2 shows a highly simplified diagram of a functional relationship to obtain the consumed energy that can be assigned to the respective appliances and all the appliances in the system as a whole.

The mode of operation of the display and measuring unit AM is now described below based on the functional units illustrated in FIG. 2. The line from branch ABH to ABH' looped into the display and measuring unit AM can be used to measure an instantaneous value of tapped voltage and/or current or map it as a signal SCH. The harmonics or oscillations, in particular of the current, then indicate which domestic appliance or domestic appliances are in operation. The oscillation mix is preferably converted to digital values by means of an AD converter, giving a precise map of the oscillations in a time-discrete and amplitude-discrete manner. Such digital values can be analyzed readily in relation to comparison values or comparison ranges. It is simply a matter of being able to supply comparison values or comparison ranges for values currently being analyzed. To this end it is particularly advantageous if the storage capacity of the display and measuring unit AM can be extended by the abovementioned external storage unit in any data processing system, such as the cloud, allowing an analyzer AN to access such comparison values for a set of harmonics that is characteristic of a defined domestic appliance. The comparison values themselves can be obtained by means of initialization procedures. It is also possible to supply ever better comparison values or comparison ranges for a defined domestic appliance in a supporting manner by means of a self-learning process. The domestic appliance can thus be identified. To this end the analyzer AN forwards the result relating to the relevant domestic appliance to the identification unit EK for further data processing.

The abovementioned comparison values and comparison ranges can however also be obtained from the manufacturer of the domestic appliances and can be made available in the external storage unit MEC by way of the databus BUS.

Provision is further made for a power value P to be formed from the instantaneous values for voltage and current in a processing and detection unit ERF, resulting by integration over a defined time segment in the consumed energy E of a defined domestic appliance. It is only necessary for the detected power P to be assigned to the identified domestic appliance by way of an assigner ZUO, so that a detected power component or integrated energy component can be assigned to a defined domestic appliance HM', H1 to HN. Provision is made here for said assignment not only to function when just one domestic appliance is operating, as distinctive operating sequences of the domestic appliances in the system of domestic appliances lead to power jumps so that the integratable power components of the individual domestic appliance, which correspond to an energy consumption that has taken place, can be assigned with a high level of accuracy. The self-learning capability as described above during processing by the central processing unit CPU also contributes to this result. Generally a power or energy component that is individualized or processed as a signal is supplied in one unit AUF per domestic appliance, resulting in the visualization part AMV of the display and measuring unit AM in the meter readings ZM, Z1, Z2, Z3 to ZN relating to the consumed energy, with a summing meter ZG also being present (see FIG. 1). It is therefore also possible to display the power consumed instantaneously in respect of a domestic appliance in the visualization part AMV by actively switching the corresponding analog or digital display ANZ by way of the rotary selector DW described above. Also all the data displayed by way of the visualization part AMV can be transmitted by way of the databus BUS (see FIG. 1) to an external location, for example the storage unit MEC, so that a third party outside the household with the system of domestic appliances HSY can have knowledge about the domestic appliances. This may be a research department of the domestic appliance manufacturer or a service company maintaining the domestic appliances.

The functional sequence described with reference to FIG. 2 depends on the harmonics, which in particular comprise the current profile of the branch ABH', being adequate to identify an individual domestic appliance in the system of domestic appliances HSY. It is however also possible for the characteristic structure of current and voltage profiles to be generated by a structure generator inside the appliance. Such structure generators are shown assigned to the domestic appliances in the system of domestic appliances HSY in FIG. 1, see ESM, ES1, ES2, ES3 to ESM. It is possible here for the structure generators to be used instead of the appliances' own structures for current and voltage profiles of the domestic appliances. The analysis can then be simplified. In contrast it is necessary to equip each domestic appliance with such a structure generator. It is however also possible only to equip domestic appliances, whose current and voltage profiles have no identifiable or analyzable characteristic structure, with a structure generator or it is even possible to assist or change the structure generated by the domestic appliance itself so that no radio interference occurs, in other words impermissible frequency ranges are blocked out and the characteristic structure is transformed to a permitted frequency range.

LIST OF REFERENCE CHARACTERS

EVU Network of energy supply company
EZ Energy meter of EVU
AB Branch
ABH Branch for domestic appliances
HSY System of domestic appliances
VD Various consumers
AM Display and measuring unit
AMV Visualization part of AM
CPU Central processing unit
MEI Storage unit/internal memory
MEC Storage unit/external memory/cloud
ANZ Instantaneous value display
DW Rotary selector
ZM Master domestic appliance consumption display
Z1 to ZN Display for domestic appliances H1 to HN
ZG Display for all domestic appliances
HM Master domestic appliance (with AM)
HM' Domestic appliance in HM
H1 to HN Further domestic appliances
ESM Structure generator in master domestic appliance
ES1 to ESN Further structure generators
CPU Central processing unit
BUS Databus
SCH Signal characteristic structure
AD Analog/digital converter
AN Analyzer
EK Identification unit
ERF Detection range P and E
P Power
E Energy
ZUO Assigner
AUF Processing for display

The invention claimed is:
1. A system of domestic appliances, wherein the domestic appliances are operated on a branch of an, in particular public, supply network for electrical energy at a standard network frequency, wherein in particular the consumed energy supplied to the branch can be detected, the system comprising:
 a display and measuring unit that allows the display and measurement of the consumed energy of an individual domestic appliance, wherein:
  its function of determining the consumption of the individual domestic appliance is based on the analysis of a characteristic structure of current and voltage profiles that can be assigned to the individual domestic appliance within network period time segments during operation of the individual domestic appliance;

the characteristic structure of individual domestic appliances whose own characteristic structure is small can be formed or added to by a structure generator; and the characteristic structure including harmonics and their amplitude size for current and voltage profiles of an operating domestic appliance.

2. The system as claimed in claim 1, characterized in that the display and measuring unit is configured within a device provide specifically for the purpose.

3. The system as claimed in claim 1, characterized in that the display and measuring unit is configured within a master domestic appliance.

4. The system as claimed in claim 1, characterized in that the display and measuring unit (AM) has a visualization part, which comprises display regions for the energy consumption of the individual domestic appliances and preferably also all the domestic appliances in the system of domestic appliances.

5. The system as claimed in claim 4, characterized in that the visualization part is assigned to the operating panel of the master domestic appliance.

6. The system as claimed in claim 1, characterized in that a signal corresponding to the characteristic structure of current or voltage profiles within network period time segments or from structure generators is converted to digital by means of an analog/digital converter and can be used in an analyzer in respect of a stored comparison range by means of an identification unit for assigning the consumed energy of the associated domestic appliance.

7. The system as claimed in claim 6, characterized in that the comparison range for the analyzer can be obtained by initialization procedures of the domestic appliance system and stored preferably in an internal storage unit of the display and measuring unit.

8. The system as claimed in claim 6, characterized in that the comparison range for the analyzer can be stored and accessed in an external storage unit, which has a data line to the display and measuring unit, it being possible for said comparison range preferably to be supplied by a manufacturer of the relevant domestic appliance.

9. The system as claimed in claim 1, characterized in that the display and measuring unit (AM) has a visualization part, which also selectively comprises a display means, as triggered by way of rotary switches, which displays the power required instantaneously for an individual domestic appliance, it being possible also for said value to be stored in particular on an external storage unit, so that a manufacturer or service company can have access thereto.

10. The system as claimed in claim 1, characterized in that an assembly kit is supplied, in order to be able to configure the system in a preferred manner in respect of a household.

* * * * *